(12) United States Patent
Wang (10) Patent No.: US 10,763,293 B2
(45) Date of Patent: Sep. 1, 2020

(54) IMAGE SENSING CHIP PACKAGE AND IMAGE SENSING CHIP PACKAGING METHOD

(71) Applicant: China Wafer Level CSP Co., Ltd., Suzhou, Jiangsu (CN)

(72) Inventor: Zhiqi Wang, Jiangsu (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 16/201,928

(22) Filed: Nov. 27, 2018

(65) Prior Publication Data
US 2019/0165030 A1 May 30, 2019

(30) Foreign Application Priority Data

Nov. 29, 2017 (CN) .......................... 2017 1 1229423
Nov. 29, 2017 (CN) ...................... 2017 2 1632054 U (51) Int. Cl.
*H01L 27/146* (2006.01)
*H01L 23/538* (2006.01)

(52) U.S. Cl.
CPC .... *H01L 27/14636* (2013.01); *H01L 23/5389* (2013.01); *H01L 27/1462* (2013.01); *H01L 27/1469* (2013.01); *H01L 27/14618* (2013.01); *H01L 27/14627* (2013.01); *H01L 27/14634* (2013.01); *H01L 27/14625* (2013.01); *H01L 27/14685* (2013.01)

(58) Field of Classification Search
CPC ......... H01L 27/14636; H01L 27/14618; H01L 23/5389

USPC ........................................................ 257/432
See application file for complete search history.

(56) References Cited

U.S. PATENT DOCUMENTS

| | | | | |
|---|---|---|---|---|
| 2008/0083980 A1* | 4/2008 | Yang | ................. | H01L 27/14618 257/700 |
| 2008/0157396 A1* | 7/2008 | Yang | .................... | H01L 23/3128 257/778 |
| 2008/0191297 A1* | 8/2008 | Yang | ................. | H01L 27/14618 257/432 |
| 2008/0191333 A1* | 8/2008 | Yang | .................... | H01L 21/6835 257/680 |
| 2008/0191335 A1* | 8/2008 | Yang | ................. | H01L 27/14618 257/680 |
| 2008/0211075 A1* | 9/2008 | Yang | ................. | H01L 27/14618 257/680 |
| 2008/0224248 A1* | 9/2008 | Yang | ................. | H01L 27/14618 257/433 |
| 2009/0026567 A1* | 1/2009 | Chen | ................. | H01L 27/14618 257/434 |

(Continued)

*Primary Examiner* — Igwe U Anya
(74) *Attorney, Agent, or Firm* — Wolf, Greenfield & Sacks, P.C.

(57) ABSTRACT

An image sensing chip package and an image sensing chip packaging method are provided. In the image sensing chip package, an image sensing chip is located in a through hole of a substrate, and a front surface of the image sensing chip is flush with a first surface of the substrate. In this way, in the image sensing chip package, a height of the image sensing chip is controlled with the first surface of the substrate as a reference. Since the first surface of the substrate does not change in the packaging process, almost no uncontrollable factor affects the height of the image sensing chip.

18 Claims, 7 Drawing Sheets

(56) References Cited

U.S. PATENT DOCUMENTS

2019/0165028 A1\* 5/2019 Wang ................ H01L 27/14618
2019/0189675 A1\* 6/2019 Wang ................ H01L 27/14636

\* cited by examiner

Figure 1

PRIOR ART

IMAGE SENSING CHIP PACKAGE AND IMAGE SENSING CHIP PACKAGING METHOD

The present application claims priorities to Chinese Patent Application No. 201711229423.0, titled "IMAGE SENSING CHIP PACKAGE AND IMAGE SENSING CHIP PACKAGING METHOD", filed on Nov. 29, 2017 with the Chinese State Intellectual Property Office and Chinese Patent Application No. 201721632054.5, titled "IMAGE SENSING CHIP PACKAGE", filed on Nov. 29, 2017 with the Chinese State Intellectual Property Office, both of which are incorporated herein by reference in their entireties.

FIELD

The present disclosure relates to the technical field of chip packaging, and in particular to an image sensing chip package and an image sensing chip packaging method.

BACKGROUND

In a conventional image sensing chip package, the image sensing chip is generally packaged by wire bonding. However, with the rapid development of integrated circuits, a size of a product cannot meet a desired requirement due to a long wire. With the development of the technology, the wafer level packaging gradually becomes a more common packaging method instead of the wire bonding packaging.

Figure 1:
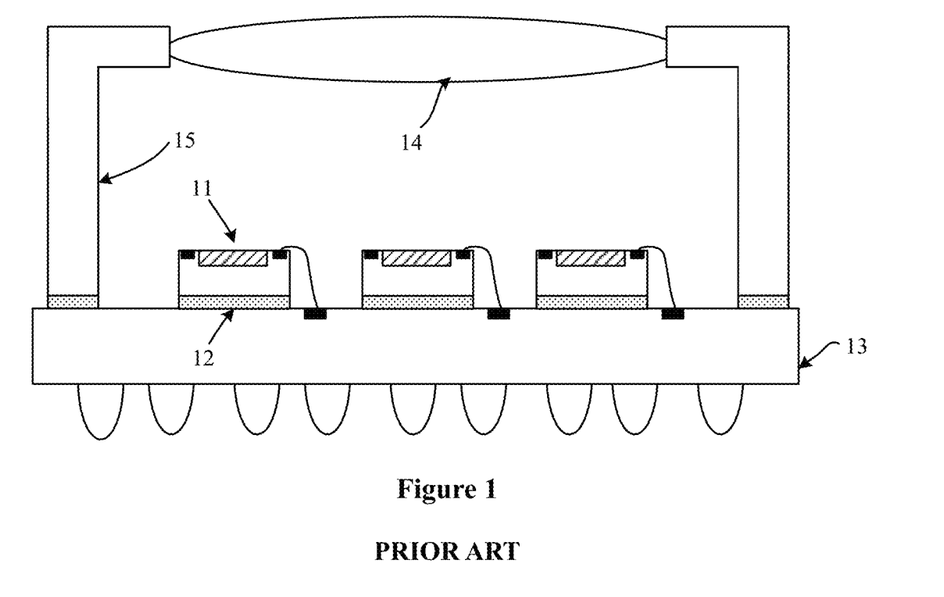
FIG. 1 is a schematic diagram of a wafer level image sensing chip package in the conventional technology.

FIG. 1 shows an existing wafer level package, in which image sensing chips 11 are secured to a substrate 13 via an adhesive 12, and a lens 14 is arranged above the image sensing chips 11. The lens 14 is supported by a lens holder 15.

In the wafer level package shown in FIG. 1, since the image sensing chips 11 are secured by using the adhesive 12, a thickness of which is not well controlled, a height of the image sensing chip 11 is not easily controlled, resulting in a large deviation between an actual height and a design height of the image sensing chip 11. Therefore, in the package, a distance between the image sensing chip 11 and the lens 14 above the image sensing chip 11 is not easily controlled, resulting in a large deviation between the actual distance and the design distance between the image sensing chip 11 and the lens 14 above the image sensing chip 11. In order to ensure the imaging quality of the image sensor, the distance between the image sensing chip and the lens above the image sensing chip is required to be strictly controlled to reduce the deviation between the actual distance and the design distance as much as possible. Therefore, the imaging quality of the image sensor is difficult to be controlled with the wafer level package shown in FIG. 1.

SUMMARY

In view of this, an image sensing chip package and an image sensing chip packaging method are provided according to embodiments of the present disclosure, to strictly control a height of an image sensing chip, thereby improving the imaging quality of an image sensor.

The following technical solutions are provided in the present disclosure.

An image sensing chip package is provided, which includes a substrate and one or more image sensing chips. The substrate includes a first surface and a second surface opposite to each other. One or more through holes penetrating the first surface and the second surface are formed on the substrate. First contact pads electrically connected to front surfaces of the image sensing chips are provided on the first surface. Second contact pads used to be electrically connected to an external circuit are provided on the second surface of the substrate. Electrical connection structures for electrically connecting the first contact pads with the second contact pads are provided in the substrate. The image sensing chips are located in the through holes, with the front surfaces of the image sensing chips being flush with the first surface of the substrate. The front surface of each of the image sensing chips is provided with a photosensitive region and third contact pads located on the periphery of the photosensitive region. Each of the third contact pads is electrically connected to one of the first contact pads via a wire.

An image sensing chip packaging method is provided, which includes: providing a substrate, where the substrate includes a first surface and a second surface opposite to each other, first contact pads electrically connected to front surfaces of one or more image sensing chips are provided on the first surface, second contact pads used to be electrically connected to an external circuit are provided on the second surface of the substrate, electrical connection structures for electrically connecting the first contact pads with the second contact pads are provided in the substrate; forming one or more through holes penetrating the first surface and the second surface on the substrate, where each of the through holes is arranged to accommodate at least one of the image sensing chips; forming a covering layer for enclosing openings of the through holes facing towards the first surface on the first surface of the substrate; placing the image sensing chips in the through holes, where the front surfaces of the image sensing chips are in contact with a surface of the covering layer, and the front surface of each of the image sensing chips is provided with a photosensitive region and third contact pads located on the periphery of the photosensitive region; connecting the image sensing chips with the substrate to form an integral structure of the image sensing chips and the substrate; removing the covering layer; and electrically connecting each of the third contact pads with the first contact pad corresponding to the third contact pad via a wire.

Compared with the conventional technology, the present disclosure has the following beneficial effects.

It can be seen from the above technical solutions, in the image sensing chip package according to the embodiment of the present disclosure, the image sensing chip is located in the through hole of the substrate, and the front surface of the image sensing chip is flush with the first surface of the substrate. In this way, in the image sensing chip package, the height of the image sensing chip is controlled with the first surface of the substrate as a reference. Since the first surface of the substrate does not change in the packaging process, almost no uncontrollable factor affects the height of the image sensing chip. Therefore, with the image sensing chip package, the height of the image sensing chip can be accurately controlled, thereby reducing a deviation between an actual height and a design height of the image sensing chip, so that the actual height of the image sensing chip is substantially the same as the design height, and thus a distance between the image sensing chip and a lens above the image sensing chip can be strictly controlled, thereby improving imaging quality of an image sensor.

BRIEF DESCRIPTION OF THE DRAWINGS

In order to more clearly illustrate technical solutions in the present disclosure and the conventional technology, the drawings to be used in the description of the technical solutions of the present disclosure and the conventional technology are briefly described below. Apparently, the drawings show only some embodiments of the present disclosure, and other drawings may be obtained by those skilled in the art without any creative work.

| Reference Numerals in the Figures: | | | |
|---|---|---|---|
| 11 | image sensing chip, | 12 | adhesive, |
| 13 | substrate, | 14 | lens, |
| 15 | lens holder, | 21 | substrate, |
| 22 | image sensing chip, | 21a | first surface, |
| 21b | second surface, | 211 | through hole, |
| 212 | first contact pad, | 213 | second contact pad, |
| 214 | electrical connection structure, | 221 | photosensitive region, |
| 222 | third contact pad, | 23 | wire, |
| 24 | plastic packaging material, | 25 | solder bump, |
| 26 | transparent protection layer, | 27 | sealed cavity, |
| 28 | support structure, | 29 | lens assembly, |
| 291 | lens, | 292 | lens holder, |
| 91 | covering layer. | | |

DETAILED DESCRIPTION

As described in the background, in order to ensure the imaging quality of an image sensor, a distance between an image sensing chip and a lens above the image sensing chip is required to be strictly controlled to be substantially the same as a design distance, so as to reduce a deviation between the actual distance and the design distance.

The distance between the image sensing chip and the lens above the image sensing chip is affected by factors including a height of the image sensing chip and a height of the lens. Therefore, the height of the image sensing chip and/or the height of the lens are required to be strictly controlled, so as to strictly control the distance between the image sensing chip and the lens above the image sensing chip.

In embodiments of the present disclosure, the distance between the image sensing chip and the lens above the image sensing chip is strictly controlled by strictly controlling the height of the image sensing chip, thereby improving the imaging quality of the image sensor.

In order to strictly control the height of the image sensing chip, in the embodiments of the present disclosure, the image sensing chip is embedded in a through hole of a substrate. Further, in order to better control the height of the image sensing chip, a front surface of the image sensing chip is caused to be flush with a first surface of the substrate, instead of a solution in the conventional technology in which the image sensing chip is adhered to a surface of the substrate by using an adhesive. Since a height of the first surface of the substrate does not change in the packaging process, the height of the image sensing chip after the packaging process is the same as the design height. Therefore, with the embodiments of the present disclosure, a deviation between the actual height and the design height of the image sensing chip can be reduced, so as to strictly control the height of the image sensing chip, thereby improving the imaging quality of the image sensor.

The embodiments of the present disclosure are described below in detail in conjunction with the drawings. It should be understood that the embodiments are not intended to limit the present disclosure. Any modifications to structures, methods or functions made by those skilled in the art based on these embodiments fall within the protection scope of the present disclosure.

To make the above objects, features and advantages of the present disclosure more apparent and easier to be understood, the embodiments of the present disclosure are illustrated in detail in conjunction with the drawings hereinafter. When describing the embodiments of the present disclosure, sectional views showing the structure of the device may be partially enlarged in accordance with a specific scale for ease of illustration. Further, the schematic views are only exemplary, and do not limit the protection scope of the present disclosure. In addition, sizes in the three-dimensional space, i.e., the length, the width and the depth should be considered in the actual manufacture.

Figure 2A:
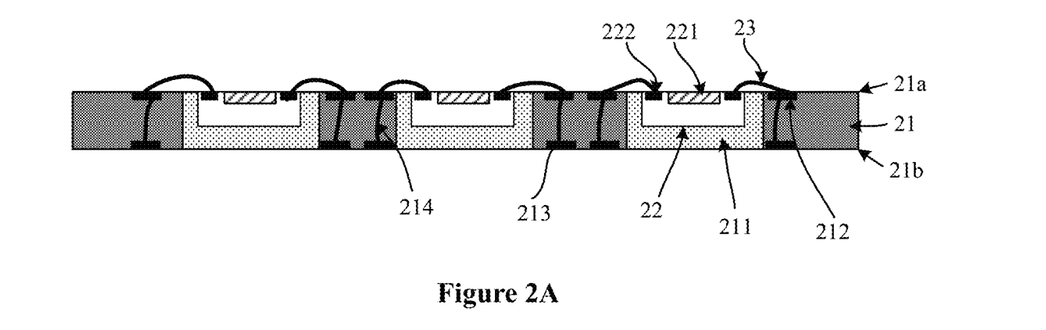
FIG. 2A is a schematic sectional view of an image sensing chip package according to an embodiment of the present disclosure.
Figure 2B:
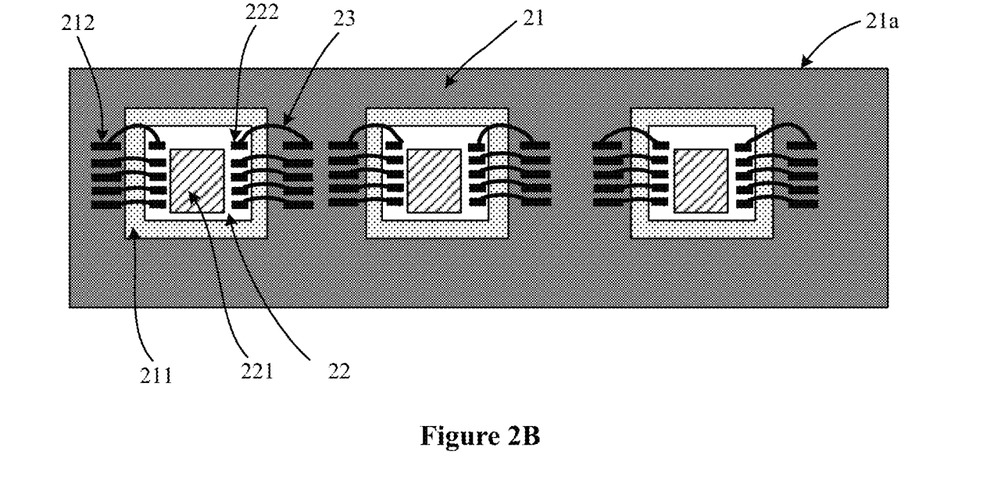
FIG. 2B is a top view of the image sensing chip package according to the embodiment of the present disclosure.

Reference is made to FIGS. 2A to 2B. FIG. 2A is a schematic sectional view of an image sensing chip package according to an embodiment of the present disclosure. FIG. 2B is a top view of the image sensing chip package according to the embodiment of the present disclosure.

As shown in FIGS. 2A and 2B, an image sensing chip package 200 includes a substrate 21 and at least one image sensing chip 22.

The substrate 21 includes a first surface 21a and a second surface 21b opposite to each other. At least one through hole 211 penetrating the first surface 21a and the second surface 21b is formed on the substrate 21.

First contact pads 212 are provided on the first surface 21a of the substrate 21.

Second contact pads 213 are provided on the second surface 21b of the substrate 21. The second contact pads 213 are used to electrically connect the substrate 21 with an external circuit.

Electrical connection structures 214 are provided in the substrate 21. The electrical connection structures 214 are used to electrically connect the first contact pads 212 with the second contact pads 213.

The image sensing chip 22 is located in the through hole 211. The front surface of the image sensing chip 22 and the first surface 21a of the substrate 21 face the same direction and located on the same plane. That is, the front surface of the image sensing chip 22 is flush with the first surface 21a of the substrate 21.

The front surface of the image sensing chip 22 is provided with a photosensitive region 221 and third contact pads 222 located on the periphery of the photosensitive region 221. The photosensitive region 221 is electrically connected to the third contact pads 222 (which is not shown in FIGS. 2A and 2B). Each of the third contact pads 222 is electrically connected to the first contact pad 212 on the first surface 21a of the substrate 21 corresponding to the third contact pad via a wire 23.

In this way, signal transmission is performed between the external circuit and the image sensing chip 22 via the second contact pad 213, the electrical connection structure 214, the first contact pad 212 and the third contact pad 222 electrically connected with each other.

Moreover, as an example of the present disclosure, a thickness of the image sensing chip 22 may be less than a thickness of the substrate 21. Since the front surface of the image sensing chip 22 is flush with the first surface 21a of the substrate 21, there is a height difference between a back surface of the image sensing chip 22 and the second surface 21b of the substrate 21. In order to fill the height difference, a region in the through hole 211 that is not occupied by the image sensing chip 22 may be filled with a plastic packaging material 24.

Moreover, in the embodiment of the present disclosure, the image sensing chip 22 is a semiconductor chip including at least an image sensing unit. The image sensing unit may be a complementary metal oxide semiconductor (CMOS) sensor or a charge coupled device (CCD) sensor. The image sensing chip 22 may further include an association circuit connected with the image sensing unit.

As an example of the present disclosure, the first contact pads 212 may be metal solder bumps protruding from the first surface 21a of the substrate 21, or a metal wiring layer arranged on the first surface 21a of the substrate 21. Similarly, the second contact pads 213 may be metal solder bumps protruding from the second surface 21b of the substrate 21, or a metal wiring layer arranged on the second surface 21b of the substrate 21.

The third contact pads 222 provided on the front surface of the image sensing chip 22 may be metal solder bumps arranged on the front surface of the image sensing chip 22, or a metal wiring layer formed on the front surface of the image sensing chip 22.

As an example of the present disclosure, the first contact pads 212, the second contact pads 213, and the third contact pads 222 may be made of Al, Au or Cu.

It should be noted that in the image sensing chip package according to the embodiment of the present disclosure, one image sensing chip 22 is arranged in each through hole 211 on the substrate 21, with front surfaces of all image sensing chips 22 being flush with the first surface 21a of the substrate 21. In this way, it can be ensured that the front surfaces of all the image sensing chips 22 are located on the same plane, and the corresponding package is as shown in FIGS. 2A and 2B.

Figure 2C:
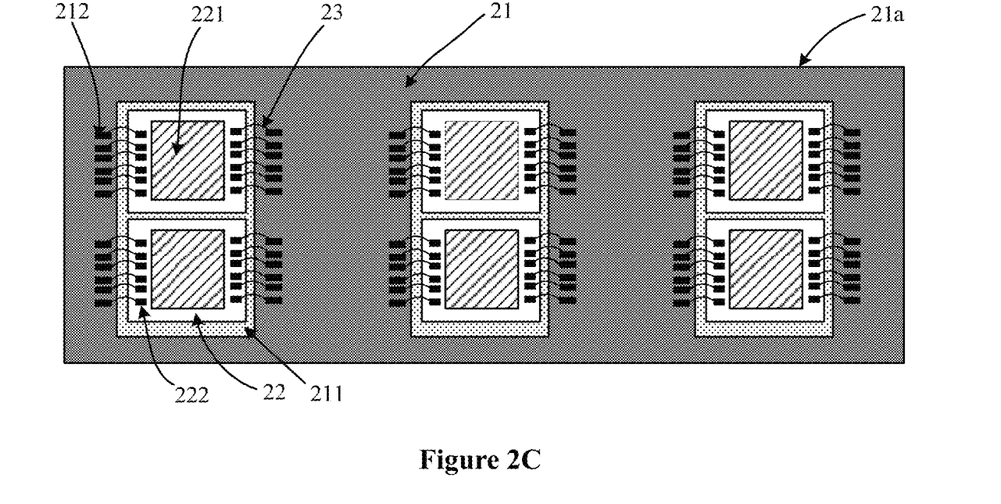
FIG. 2C is a top view of an image sensing chip package according to another embodiment of the present disclosure.

Alternatively, multiple image sensing chips 22 may be arranged in each through hole 211, with front surfaces of all image sensing chips 22 being flush with the first surface 21a of the substrate 21. In this way, it can be ensured that the front surfaces of all the image sensing chips 22 are located on the same plane, and a top view of the corresponding package is as shown in FIG. 2C.

Figure 3:
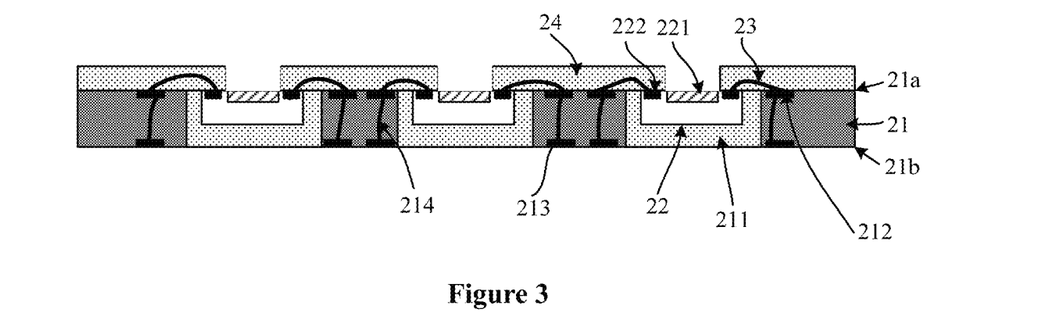
FIG. 3 is a schematic sectional view of an image sensing chip package according to another embodiment of the present disclosure.

As another example of the present disclosure, as shown in FIG. 3, in order to protect the wire 23 from being scratched, the wire 23 may be wrapped by the plastic packaging material. In order to realize that the wire 23 is wrapped by the plastic packaging material 24, other regions on the first surface 21a of the substrate 21 and the front surface of the image sensing chip 22 than the photosensitive region 221 are wrapped by the plastic packaging material to form a plastic package.

Figure 4:
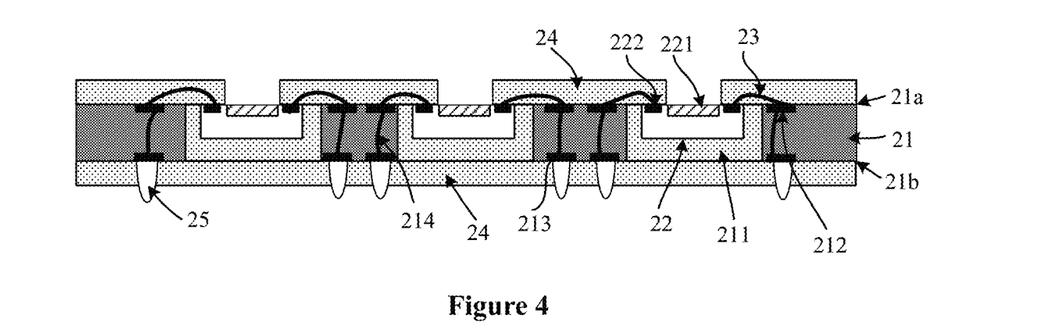
FIG. 4 is a schematic sectional view of an image sensing chip package according to another embodiment of the present disclosure.

Moreover, as another example of the present disclosure, in order to facilitate the electrical connection between the image sensing chip package and the external circuit, as shown in FIG. 4, a solder bump 25 may be formed on each of the second contact pads 213. More specifically, the solder bump 25 may be a metal solder ball. For example, the metal solder ball may be implemented by a metal tin ball.

As another example of the present disclosure, in order to protect the substrate 21, a plastic packaging process may be performed on the second surface 21b of the substrate 21, to form a plastic package on the second surface side of the substrate 21. Moreover, in order to facilitate the electrical connection between the image sensing chip package and the external circuit, the package on the second surface side formed by the plastic packaging process is required to be grinded to expose the solder bumps 25. In this way, other regions on the side of the second surface 21b of the substrate 21 than the second contact pads 213 are covered with the plastic packaging material 24, and thus the image sensing chip 22 and the substrate can be wrapped by the plastic packaging material 24 to form the plastic package.

Figure 5:
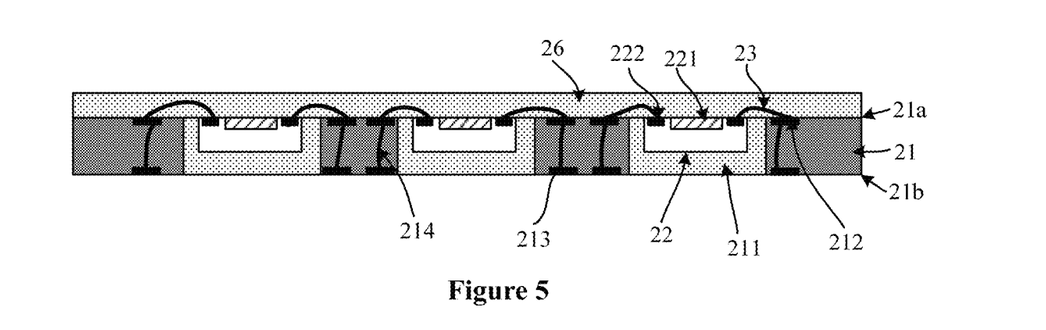
FIG. 5 is a schematic sectional view of an image sensing chip package according to another embodiment of the present disclosure.

Moreover, as another example of the present disclosure, in order to prevent the photosensitive region 221 from being contaminated by external environments, as shown in FIG. 5, based on the package according to any one of the above examples, the image sensing chip package may further include a transparent protection layer 26 for protecting the photosensitive region 221, which is arranged on the first surface 21a of the substrate 21. The transparent protection layer 26 may be an anti-reflection glass layer. Moreover, the transparent protection layer 26 may also be a plastic film.

It should be noted that the package shown in FIG. 5 is obtained based on the package shown in FIG. 2A. The transparent protection layer 26 may be added to the package shown in FIG. 3 or FIG. 4, to prevent the photosensitive region 211 from being contaminated by external environments.

It should be noted that, since the transparent protection layer 26 is a transparent material layer, a lens assembly may be directly assembled on the transparent protection layer 26 or may be assembled on the first surface 21a of the substrate 21 after the transparent protection layer 26 is removed. In the latter case, no chromatic aberration or ghost image occurs in images generated by the formed image sensor, improving the imaging quality of the image sensor.

Figure 6:
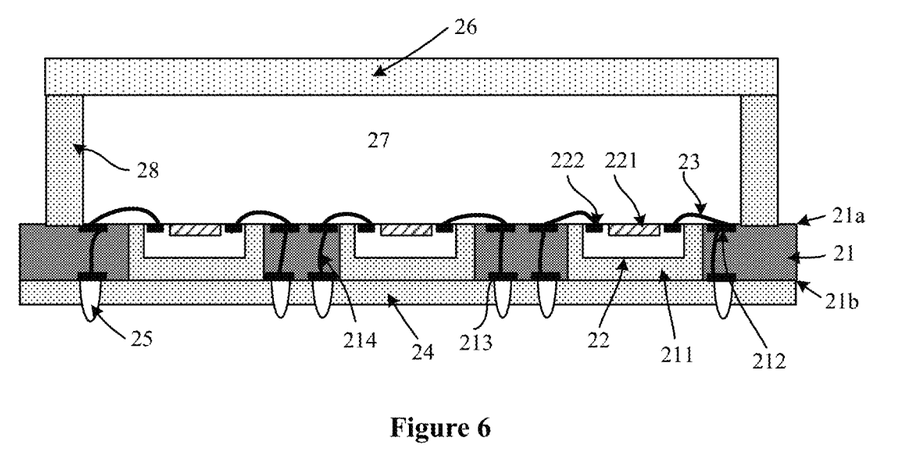
FIG. 6 is a schematic sectional view of an image sensing chip package according to another embodiment of the present disclosure.

As an example of the present disclosure, the transparent protection layer 26 may be closely adjacent to the first surface 21a of the substrate 21, and a sectional view of the corresponding package is as shown in FIG. 5. As another example of the present disclosure, as shown in FIG. 6, the transparent protection layer 26 is separated from the first surface 21a of the substrate 21 by a certain distance, a sealed cavity 27 is formed between the transparent protection layer 26 and the image sensing chips 22, and the photosensitive regions 211 are located in the sealed cavity 27. In this way, the photosensitive regions 211 can be prevented from being contaminated by contaminations such as dusts. As an example of the present disclosure, in order to form the sealed cavity 27 between the transparent protection layer 26 and the image sensing chips 22, a support structure 28 for supporting the transparent protection layer 26 is formed on the first surface 21a of the substrate 21. The support structure 28 is located between the transparent protection layer 26 and the image sensing chips 22, and the sealed cavity 27 is formed by surrounding the support structure 28, the transparent protection layer 26 and the image sensing chips 22.

In the embodiment of the present disclosure, the support structure 28 may be made of a photoresist, and is formed on the first surface 21a of the substrate 21 by an exposure and development process.

In other embodiments, other devices such as a resistor, an inductor, a capacitor, an integrated circuit block or an optical component may be arranged on the first surface 21a of the substrate 21, which may be determined based on types of the substrate and the image sensing chip.

In implementations of the packages shown in FIGS. 2A to 6, no lens assembly is arranged on the first surface 21a of the substrate 21. In order to manufacture an image device, a lens assembly is required to be installed on the first surface 21a of the substrate 21, and a lens in the lens assembly is arranged opposite to the photosensitive region 221 of the image sensing chip 22.

Figure 7:
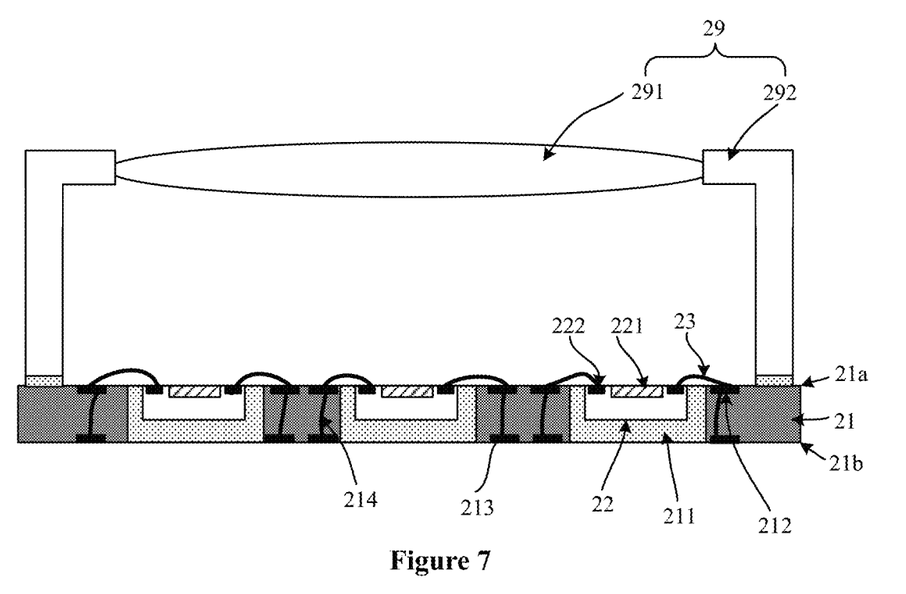
FIG. 7 is a schematic sectional view of an image sensing chip package according to another embodiment of the present disclosure.

As another implementation of the present disclosure, a lens assembly may be arranged on the first surface 21a of the substrate, and a schematic sectional view of the corresponding package is as shown in FIG. 7.

It should be noted that, the package shown FIG. 7 is obtained based on the image sensing chip package shown in FIG. 2A, and the image sensing chip package shown in FIG. 7 is similar to the image sensing chip package shown in FIG. 2A. For the sake of brevity, only the difference is emphasized herein, and the similarity may refer to the related description of FIG. 2A.

In addition to components shown in FIG. 2A, the image sensing chip package shown in FIG. 7 may further include a lens assembly 29 arranged on the first surface 21a of the substrate 21.

The lens assembly 29 includes a lens 291 and a lens holder 292. The lens holder 292 is fixedly connected to the first surface 21a of the substrate 21. As an example, the lens holder 292 may be adhered to the first surface 21a of the substrate 21 by using an adhesive. In order to make light that passes through the lens 291 be easily detected by the photosensitive region 221, as an example, the lens 291 may be arranged opposite to the photosensitive region 221 of the image sensing chip 22. For example, one lens 291 may correspond to one image sensing chip 22 or multiple image sensing chips 22.

In the embodiment of the present disclosure, since there is a certain space between the substrate 21 and the lens 291, other devices may be formed on the first surface of the substrate 21, which forms a high-density stacked structure between the lens holder 292 and the substrate 21, thereby facilitating miniaturization of the devices. Further, optical assembles such as a polarizer and an infrared filter may be formed between the lens 291 and the first surface 21a of the substrate 21, so as to improve the imaging quality of the image sensor.

It should be noted that the above example is an example obtained by adding a lens assembly to the package shown in FIG. 2A. The lens assembly may be added to the package shown in any one of FIGS. 3 to 6. Based on the disclosed implementation of adding the lens assembly to the package in FIG. 2A, it is conceivable for those skilled in the art to add a lens assembly to the package shown in any one of FIGS. 3 to 6, which is not repeated herein for the sake of brevity.

In the above implementation including the lens assembly, the image sensing chip package includes the lens assembly. In this way, there is no need to additionally assemble the lens assembly in forming the image sensor, saving an assembly process of the image sensor.

The implementations of the image sensing chip package according to the embodiment of the present disclosure are described above. In the above implementations, the image sensing chip 22 is packaged in the through hole 211 of the substrate 21, and the front surface of the image sensing chip 22 is flush with the first surface 21a of the substrate 21. In this way, in the image sensing chip package, the height of the image sensing chip 22 is controlled with the first surface 21a of the substrate 21 as a reference. Since the first surface 21a of the substrate 21 does not change in the packaging process, almost no uncontrollable factor affects the height of the image sensing chip. Therefore, with the image sensing chip package, the height of the image sensing chip can be accurately controlled, thereby reducing the deviation between an actual height and a design height of the image sensing chip, so that the actual height of the image sensing chip is substantially the same as the design height. Therefore, with the implementation, the deviation between the actual height and the design height of the image sensing chip can be reduced, so as to strictly control the height of the image sensing chip, thereby improving the imaging quality of the image sensor.

The above shows implementations of the image sensing chip package according to the embodiment of the present disclosure. Based on the implementations, an implementation of an image sensing chip packaging method is further provided according to an embodiment of the present disclosure.

Figure 8:
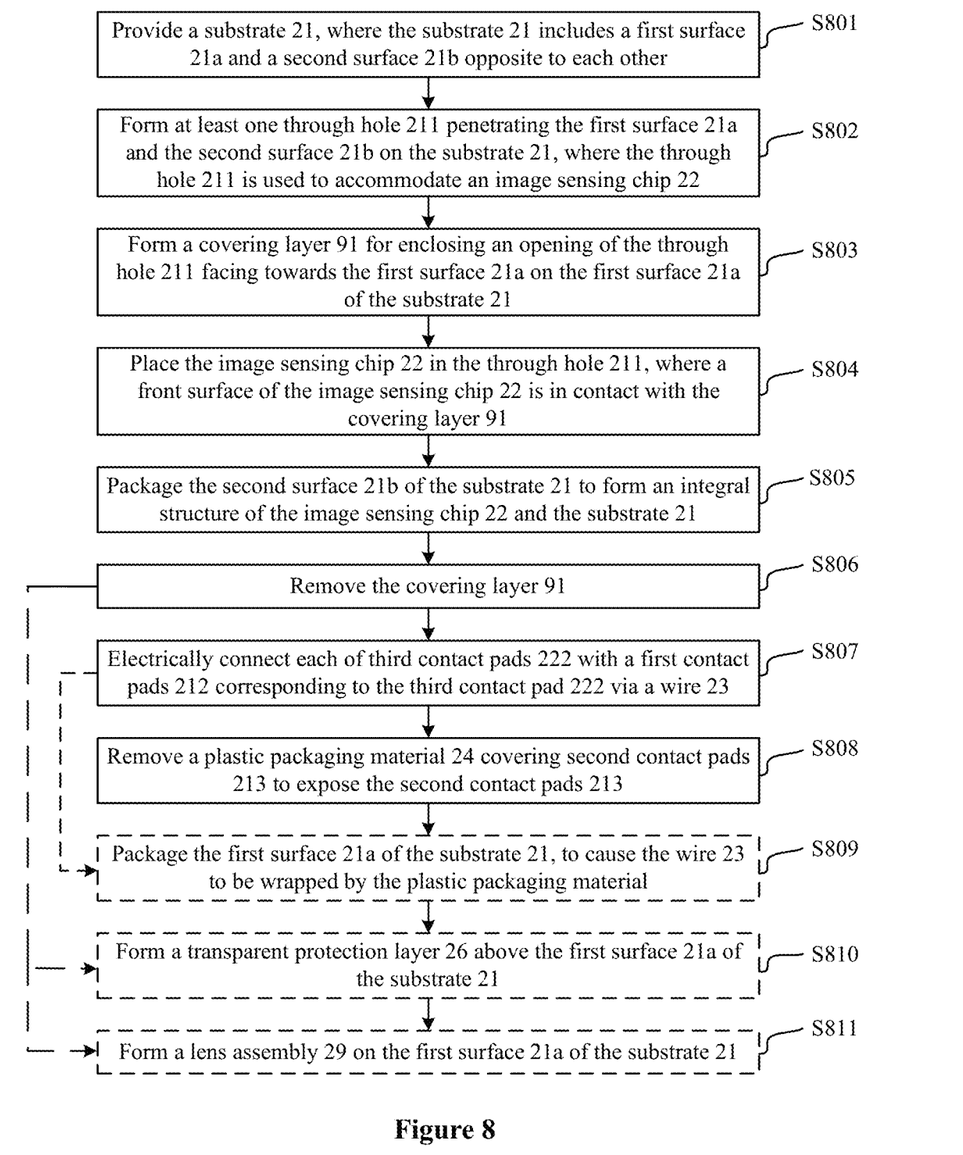
FIG. 8 is a schematic flowchart of an image sensing chip packaging method according to an embodiment of the present disclosure.
Figure 9A:
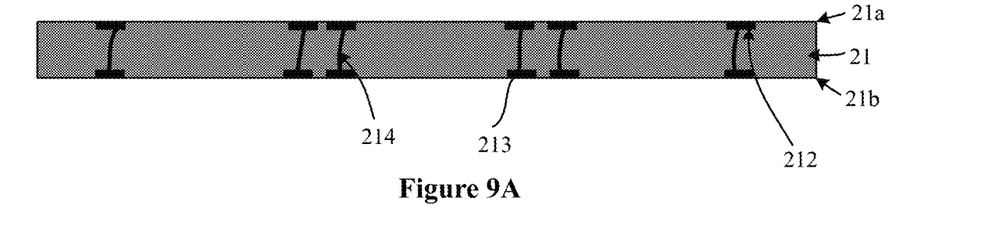
FIGS. 9A to 9F show schematic sectional diagrams corresponding to a series of flows in the image sensing chip packaging method according to the embodiment of the present disclosure.
Figure 9B:
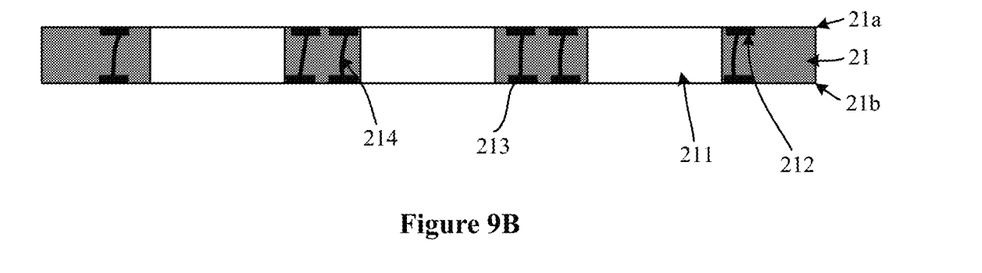
Figure 9C:
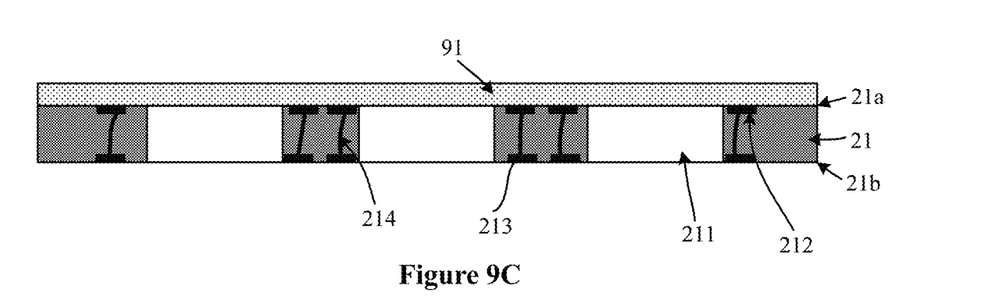
Figure 9D:
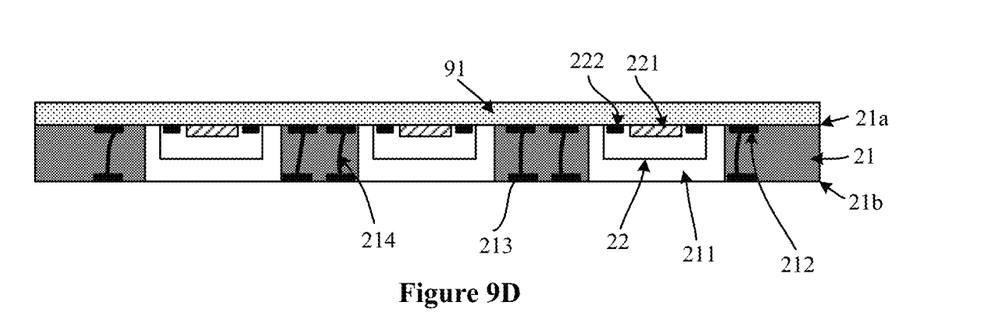
Figure 9E:
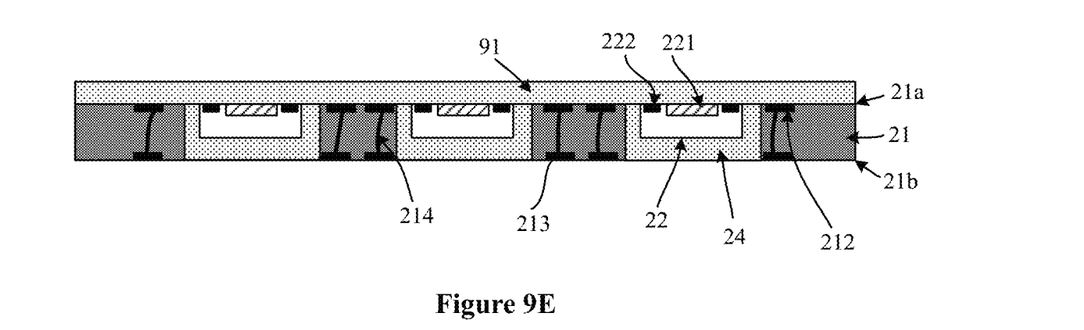
Figure 9F:
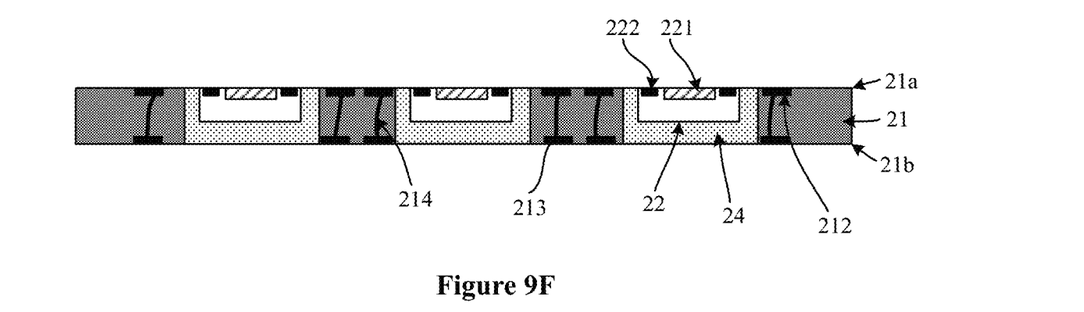

Reference is made to FIGS. 8 to 9F. The image sensing chip packaging method provided in the embodiment of the present disclosure includes the following steps S801 to S808.

In S801, a substrate 21 is provided. The substrate 21 includes a first surface 21a and a second surface 21b opposite to each other.

As shown in FIG. 9A, the substrate 21 includes a first surface 21a and the second surface 21b opposite to each other. As an example, the substrate 21 may be a printed circuit board (PCB).

First contact pads 212 are provided on the first surface 21a of the substrate 21. Second contact pads 213 are provided on the second surface 21b of the substrate 21. The second contact pads 213 are used to electrically connect the substrate 21 with an external circuit.

Electrical connection structures 214 are provided in the substrate 21. The electrical connection structures 214 are used to electrically connect the first contact pads 212 with the second contact pads 213.

In S802, at least one through hole 211 penetrating the first surface 21a and the second surface 21b is formed on the substrate 21. The through hole 211 may accommodate at least one image sensing chip 22.

As shown in FIG. 9B, at least one through hole 211 penetrating the first surface 21a and the second surface 21b is formed on the substrate 21 by an etching process or a cutting process. As an example, FIG. 9B shows a case that three through holes 211 penetrating the first surface 21a and the second surface 21b are formed on the substrate 21.

It should be noted that the through hole 211 does not damage the electric connection structures 214 in the substrate 21, as well as the first contact pads 212 and the second contact pads 213.

The formed through hole 211 is not electrically connected with and the electrical connection structures 214, the first contact pads 212 and the second contact pads 213.

Since the through hole 211 is used to accommodate at least one image sensing chip 22, a size of the through hole 211 is at least not less than that of the image sensing chip 22. Further, shapes of the through hole 211 and the image sensing chip 22 may be the same or different.

In S803, a covering layer 91 for enclosing an opening of the through hole 211 facing towards the first surface 21a is formed on the first surface 21a of the substrate 21.

As shown in FIG. 9C, a covering layer 91 for enclosing an opening of the through hole 211 facing towards the first surface 21a is formed on the first surface 21a of the substrate 21. As an example, the covering layer 91 may be an adhesive strip or a carrier plate.

In a case where the covering layer 91 is an adhesive strip, step S803 may be performed by sticking the adhesive strip enclosing the opening of the through hole 211 facing towards the first surface 21a on the first surface 21a of the substrate 21.

In a case where the covering layer 91 is a carrier plate, step S803 may be performed by detachably fixing the carrier plate on the first surface 21a of the substrate 21.

In S804, the image sensing chip 22 is placed in the through hole 211. The front surface of the image sensing chip 22 is in contact with a surface of the covering layer 91.

Since the opening of the through hole 211 facing towards the first surface 21a is enclosed by the covering layer 91, the through hole 211 with the enclosed opening becomes a recessed structure. The covering layer 91 is regarded as the bottom of the recessed structure. In this way, the image sensing chip 22 may be placed in the through hole 211 (i.e., the recessed structure) with the enclosed opening. Since the formed through hole 211 may accommodate the image sensing chip 22, the image sensing chip 22 can be placed on a bottom surface of the recessed structure. That is, the front surface of the image sensing chip 22 is in contact with the surface of the covering layer 91. A schematic sectional view of the package formed after step 804 is as shown in FIG. 9D.

In the embodiment of the present disclosure, the front surface of the image sensing chip 22 is provided with a photosensitive region 221 and third contact pads 222 located on the periphery of the photosensitive region 221. The photosensitive region 221 is electrically connected to the third contact pads 222.

In S805, the second surface 21b of the substrate 21 is packaged to form an integral structure of the image sensing chip 22 and the substrate 21.

In order to connect the substrate 21 with the image sensing chip 22 together, the second surface 21b of the substrate 21 may be packaged using a plastic packaging material (which is generally implemented by a mold compound), to form a plastic package on a side of the second surface 21b of the substrate 21.

In a case where a thickness of the image sensing chip 22 is less than a thickness of the substrate 21, there is a certain gap on a side of the through hole 211 close to the second surface 21b after the image sensing chip 22 is placed in the substrate 21. In this case, in the packaging process, the through hole 211 may be filled with the plastic packaging material until the through hole 211 is completely filled.

A schematic sectional view of the package formed after step S805 is as shown in FIG. 9E.

In S806, the covering layer 91 is removed.

As an example, in the case where the covering layer 91 is the adhesive strip, the adhesive strip may be removed from the first surface 21a of the substrate 21.

In the case where the covering layer 91 is the carrier plate, the carrier plate may be detached from the first surface 21a of the substrate 21.

A schematic sectional view of the package formed after step S806 is as shown in FIG. 9F.

In S807, each of the third contact pads 222 is electrically connected with the first contact pad 212 corresponding to the third contact pad via a wire 23.

In order to electrically connect the image sensing chip 22 with the substrate 21, in the embodiment of the present disclosure, each of the third contact pads 222 is electrically connected with the first contact pad 212 via the wire 23.

A schematic sectional view of the package formed after step S807 is as shown in FIG. 2A.

In S808, if the second surface 21b is wrapped by the plastic packaging material 24 when packaging the second surface 21b of the substrate 21, the plastic packaging material 24 that covers the second contact pads 213 is removed to expose the second contact pads 213.

The plastic package formed on the side of the second surface 21b is grinded until the plastic packaging material 24 that covers the second contact pads 213 is removed, to expose the second contact pads 213. The exposed second contact pads 213 are electrically connected with the external circuit.

It should be noted that, in the embodiment of the present disclosure, the implementation of performing step S808 after step S805 falls in the protection scope of the present disclosure. As an example, step S808 may be performed after step S805 or step S807.

In addition, the wire 23 for the electrical connection is generally implemented by a thinner metal wire, which is easily scratched. In order to prevent the wire 23 from being scratched, the image sensing chip packaging method may further include the following step S809.

In S809, the first surface 21a of the substrate 21 is packaged, to cause the wire 23 to be wrapped by the plastic packaging material.

Step S809 may be performed by packaging the first surface 21a of the substrate 21 using a mold compound, to form the plastic package on the side of the first surface 21a of the substrate 21. The plastic package wraps the wire 23, but does not wrap the photosensitive region 221 located on the front surface of the image sensing chip 22.

A schematic sectional view of the package formed after step S809 is as shown in FIG. 3.

In order to prevent the photosensitive region 221 located on the front surface of the image sensing chip 22 from being contaminated by dusts, the image sensing chip packaging method may further include the following step S810 after step S807 or S809.

In S810, a transparent protection layer 26 is formed above the first surface 21a of the substrate 21.

As an example of the present disclosure, the transparent protection layer 26 may be closely adjacent to the first surface 21a of the substrate 21, and a sectional view of the corresponding package is as shown in FIG. 5. As another example of the present disclosure, as shown in FIG. 6, a sealed cavity 27 is formed between the transparent protection layer 26 and the image sensing chip 22.

In the case that the sealed cavity 27 is formed between the formed transparent protection layer 26 and the image sensing chip 22, S810 may be performed by steps including: forming a support structure 28 for supporting the transparent protection layer 26 on the first surface 21a of the substrate 21, where the support structure 28 is located between the transparent protection layer 26 and the image sensing chip 22; and forming the transparent protection layer 26 on the support structure 28, where the sealed cavity 27 is formed by enclosing the support structure 28, the transparent protection layer 26 and the image sensing chip 22.

In the embodiment of the present disclosure, the support structure 28 may be made of a photoresist, and is formed on the first surface 21a of the substrate 21 by an exposure and development process.

Further, in order to form the image sensing chip package including a lens assembly, the image sensing chip packaging method may further include the following step S811 after step S807 or S809.

In S811, a lens assembly 29 is formed on the first surface 21a of the substrate 21.

The lens assembly 29 includes a lens 291 and a lens holder 292. The lens holder 292 is fixedly connected to the first surface 21a of the substrate 21. As an example, the lens holder 292 may be adhered to the first surface 21a of the substrate 21 by using an adhesive. In order to make light that passes through the lens 291 be easily detected by the photosensitive region 221, as an example, the lens 291 may be arranged opposite to the photosensitive region 221 of the image sensing chip 22. For example, one lens 291 may correspond to one image sensing chip 22 or multiple image sensing chips 22.

In the embodiment of the present disclosure, since there is a certain space between the substrate 21 and the lens 291, other devices may be formed on the first surface of the substrate 21, which forms a high-density stacked structure between the lens holder 292 and the substrate 21, thereby facilitating miniaturization of the devices. Further, optical assembles such as a polarizer and an infrared filter may be formed between the lens 291 and the first surface 21a of the substrate 21, so as to improve the imaging quality of the image sensor.

A schematic sectional view of the package formed after step S811 is as shown in FIG. 7.

The image sensing chip packaging method according to the embodiment of the present disclosure is described above. In the image sensing chip packaging method, since an opening of the through hole close to the first surface of the substrate is enclosed by a covering layer in the packaging process, the image sensing chip placed in the through hole can be carried by the covering layer, so that a front surface of the image sensing chip placed in the through hole is flush with the first surface of the substrate. A second surface of the substrate is packaged, so that the image sensing chip is packaged with the substrate together. In this way, the image sensing chip is packaged in the through hole, and the front surface of the image sensing chip is flush with the first surface of the substrate. Therefore, with the image sensing chip packaging method, the height of the image sensing chip can be easily controlled, thereby reducing the deviation between an actual height and a design height of the image sensing chip, so that the actual height of the image sensing chip is substantially the same as the design height, and thus the distance between the image sensing chip and the lens above the image sensing chip can be strictly controlled, thereby improving the imaging quality of the image sensor.

The above shows only preferred embodiments of the present disclosure. It should be noted that, those skilled in the art may make improvements and modifications to embodiments of the present disclosure without departing from the principle of the present disclosure, and the improvements and modifications should be included in the protection scope of the present disclosure.

The invention claimed is:

1. An image sensing chip package, comprising:
a substrate; and
one or more image sensing chips, wherein
the substrate comprises a first surface and a second surface opposite to each other, one or more through holes penetrating the first surface and the second surface are formed on the substrate, first contact pads electrically connected to front surfaces of the image sensing chips are provided on the first surface, second contact pads used to be electrically connected to an external circuit are provided on the second surface of the substrate, electrical connection structures for electrically connecting the first contact pads with the second contact pads are provided in the substrate; and
the image sensing chips are located in the through holes, the through holes with the image sensing chips are filled with a plastic packaging material, the front surfaces of the image sensing chips is controlled to be flush with the first surface of the substrate based on the first surface of the substrate, and the front surface of each of the image sensing chips is provided with a photosensitive region and third contact pads located on the periphery of the photosensitive region, each of the third contact pads is electrically connected to one of the first contact pads via a wire, and the wire is wrapped by the plastic packaging material.

2. The image sensing chip package according to claim 1, further comprising:
a lens assembly arranged on the first surface of the substrate.

3. The image sensing chip package according to claim 2, wherein the lens assembly comprises a lens and a lens holder, and the lens holder is fixedly connected to the first surface of the substrate.

4. The image sensing chip package according to claim 1, further comprising:
a transparent protection layer formed above the first surface of the substrate.

5. The image sensing chip package according to claim 4, wherein the transparent protection layer is an anti-reflection glass layer.

6. The image sensing chip package according to claim 4, wherein a sealed cavity is formed between the transparent protection layer and the image sensing chips.

7. The image sensing chip package according to claim 1, further comprising:
solder bumps formed on the second contact pads.

8. The image sensing chip package according to claim 7, wherein the solder bumps are metal solder balls.

9. The image sensing chip package according to claim 1, wherein one of the image sensing chips is arranged in each of the through holes, with the front surfaces of the image sensing chips being flush with the first surface of the substrate.

10. The image sensing chip package according to claim 1, wherein at least two of the image sensing chips are arranged in each of the through holes, with the front surfaces of the image sensing chips being flush with the first surface of the substrate.

11. An image sensing chip packaging method, comprising:
- providing a substrate, wherein the substrate comprises a first surface and a second surface opposite to each other, first contact pads electrically connected to front surfaces of one or more image sensing chips are provided on the first surface, second contact pads used to be electrically connected to an external circuit are provided on the second surface of the substrate, electrical connection structures for electrically connecting the first contact pads with the second contact pads are provided in the substrate;
- forming one or more through holes penetrating the first surface and the second surface on the substrate, wherein each of the through holes is arranged to accommodate at least one of the image sensing chips;
- forming a covering layer for enclosing openings of the through holes facing towards the first surface on the first surface of the substrate;
- placing the image sensing chips in the through holes, wherein the front surfaces of the image sensing chips are in contact with a surface of the covering layer, and the front surface of each of the image sensing chips is provided with a photosensitive region and third contact pads located on the periphery of the photosensitive region;
- connecting the image sensing chips with the substrate to form an integrated structure of the image sensing chips and the substrate, comprising:
  - packaging the second surface of the substrate and filling the through holes with a plastic packaging material to form an integrated structure of the image sensing chips and the substrate by using the plastic packaging material;
- removing the covering layer;
- electrically connecting each of the third contact pads with the first contact pad corresponding to the third contact pad via a wire; and
- packaging the first surface of the substrate, wherein the wire is wrapped by the plastic packaging material.

12. The image sensing chip packaging method according to claim 11, wherein the covering layer is an adhesive strip that covers the first surface.

13. The image sensing chip packaging method according to claim 11, wherein the covering layer is a carrier plate that covers the first surface.

14. The image sensing chip packaging method according to claim 11, wherein after packaging the second surface of the substrate and filling the through holes with the plastic packaging material, the image sensing chip packaging method further comprises:
- removing the plastic packaging material that covers the second contact pads to expose the second contact pads.

15. The image sensing chip packaging method according to claim 11, wherein after electrically connecting each of the third contact pads with the first contact pad corresponding to the third contact pad via a wire, the image sensing chip packaging method further comprises:
- forming a lens assembly on the first surface of the substrate.

16. The image sensing chip packaging method according to claim 15, wherein the lens assembly comprises a lens and a lens holder, and the lend holder is fixedly connected to the first surface of the substrate.

17. The image sensing chip packaging method according to claim 11, wherein after electrically connecting each of the third contact pads with the first contact pad corresponding to the third contact pad via a wire, the image sensing chip packaging method further comprises:
- forming a transparent protection layer above the first surface of the substrate.

18. The image sensing chip packaging method according to claim 17, wherein a sealed cavity is formed between the transparent protection layer and the image sensing chips.

* * * * *